(12) United States Patent
Bartsch et al.

(10) Patent No.: US 6,232,625 B1
(45) Date of Patent: May 15, 2001

(54) SEMICONDUCTOR CONFIGURATION AND USE THEREOF

(75) Inventors: Wolfgang Bartsch, Erlangden; Heinz Mitlehner, Uttenreuth; Dietrich Stephani, Bubenreuth, all of (DE)

(73) Assignee: SiCED Electronics Development GmbH & Co. KG, Erlangen (DE)

( * ) Notice: Subject to any disclaimer, the term of this patent is extended or adjusted under 35 U.S.C. 154(b) by 0 days.

(21) Appl. No.: 09/472,060

(22) Filed: Dec. 23, 1999

Related U.S. Application Data

(63) Continuation of application No. PCT/DE98/01619, filed on Jun. 15, 1998.

(30) Foreign Application Priority Data

Jun. 24, 1997 (DE) .............................................. 197 26 678

(51) Int. Cl.[7] .................................................. H01L 29/80
(52) U.S. Cl. .......................... 257/263; 257/266; 257/287; 257/260
(58) Field of Search .......................... 257/260, 263–270, 257/280–283, 287, 497, 498

(56) References Cited

U.S. PATENT DOCUMENTS

| | | | |
|---|---|---|---|
| 4,546,401 | * 10/1985 | Svedberg ................................ | 361/91 |
| 5,077,589 | * 12/1991 | Holm et al. .......................... | 357/23.4 |
| 5,543,637 | 8/1996 | Baliga . | |
| 5,629,536 | * 5/1997 | Heminger et al. ................... | 257/173 |
| 6,034,385 | * 3/2000 | Stephani et al. ..................... | 257/263 |

FOREIGN PATENT DOCUMENTS

| | | | |
|---|---|---|---|
| 9411601 U | 10/1994 | (DE) . | |
| 1285915 | 4/1967 | (FR) . | |
| 59-41871 | * 3/1984 | (JP) ..................................... | 257/263 |
| 59-52882 | * 3/1984 | (JP) ..................................... | 257/263 |
| 59-65486 | * 4/1984 | (JP) ..................................... | 257/263 |
| WO 95/07548 | 3/1995 | (WO) . | |
| WO 96/19831 | 6/1996 | (WO) . | |
| WO 97/23911 | 7/1997 | (WO) . | |

OTHER PUBLICATIONS

"Polyäthylen–Stromwächter für den Kurzschlussschutz" (T. Hansson), ABB Technik Apr. 1992, pp. 35–38.

* cited by examiner

Primary Examiner—Sara Crane
(74) Attorney, Agent, or Firm—Herbert L. Lerner; Laurence A. Greenberg; Werner H. Stemer

(57) ABSTRACT

A semiconductor configuration, in particular based on silicon carbide, is specified which rapidly limits a short-circuit current to an acceptable current value. For this purpose, when a predetermined saturation current is exceeded, a lateral channel region is pinched off, and the current is limited to a value below the saturation current.

22 Claims, 8 Drawing Sheets

SEMICONDUCTOR CONFIGURATION AND USE THEREOF

CROSS-REFERENCE TO RELATED APPLICATION

This is a continuation of copending International Application PCT/DE98/01619, filed Jun. 15, 1998, which designated the United States.

BACKGROUND OF THE INVENTION

Field of the Invention

The invention relates to a semiconductor configuration that is suitable for passively limiting an electric current, and also to the use of such a semiconductor configuration.

In order to supply an electrical load (apparatus) with an electric current, the load is connected to a line branch of an electrical supply network via a switching device. In order to protect the load against excessively high currents, in particular in the event of a short circuit, in low-voltage switching technology use is made of a switching device having a disconnector, which protects the line branch and for which a fuse is generally used, and having a mechanical power circuit-breaker having a switching time of distinctly more than one millisecond (1 ms). If a plurality of loads are operated simultaneously in a line branch and a short circuit occurs in only one of these loads, then it is highly advantageous if the loads which are not affected by the short circuit can continue to operate without disruption and only the load affected by the short circuit is switched off. For this purpose, current-limiting components ("limiters") are necessary that are connected directly upstream of each load and in each case reliably limit the current of the prospective short-circuit current to a predetermined, noncritical overcurrent value within a time of distinctly less than 1 ms and, consequently, before the tripping of the disconnector provided for the line branch. Furthermore, the current-limiting components should operate passively without the need for being driven and be able to withstand the voltages that are present in the current-limiting situation and are usually as much as 700 V, and sometimes as much as 1200 V. Since the power loss then arising in the component is very high, it would be particularly advantageous if, in addition, the passive current limiter automatically reduced the current to values distinctly below the predetermined over-current value with the additional take-up of voltage (intrinsically safe component).

The only passive current limiter that is commercially available is the apparatus which is described in the paper "Polyäthylen-Stromwächter für den Kurzschlußschutz" [Polyethylene Current Monitor For Short-Circuit Protection] by T. Hansson, ABB Technik 4/92, pages 35–38 and having the product name PROLIM, which is based on a current-dependent conductivity of the grain boundaries of the material used in this apparatus. However, if the apparatus is used relatively frequently for current limiting, a change may occur in the current saturation value at which the current is limited.

Otherwise, it is generally the case that only active current limiters are used, which detect the current and limit it by active control in the event of a predetermined maximum current value being exceeded. Published, Non-Prosecuted German Patent Application DE 43 30 459 A discloses such an active, semiconductor-based current limiter. The latter has a first semiconductor region of a predetermined conduction type, to which a respective electrode is assigned on surfaces that are remote from one another. In the first semiconductor region, further semiconductor regions of the opposite conduction type are disposed spaced apart from one another between the two electrodes. Respective channel regions of the first semiconductor region are formed between the further semiconductor regions, the channel regions being directed perpendicularly with respect to the two surfaces of the first semiconductor region (vertical channels). A vertical current flow between the two electrodes is guided through the channel regions and thereby limited. In order to control the current flow between the two electrodes, a gate voltage is applied to the oppositely doped semiconductor regions in the first semiconductor region and controls the resistances of the channel regions.

SUMMARY OF THE INVENTION

It is accordingly an object of the invention to provide a semiconductor configuration and use thereof which overcomes the above-mentioned disadvantages of the prior art devices of this general type, which can be used for passively limiting electric currents in the event of a critical current value being exceeded. The intention is also to specify a current limiter configuration having such a semiconductor configuration.

With the foregoing and other objects in view there is provided, in accordance with the invention, a semiconductor configuration, including:

a first semiconductor region having a first surface and at least one contact region disposed at the first surface;

at least one second semiconductor region forming a first p-n junction with the first semiconductor region and the first p-n junction having a depletion zone;

at least one third semiconductor region disposed at the first surface of the first semiconductor region forming a second p-n junction with the first semiconductor region and the second p-n junction having a depletion zone, the at least one third semiconductor region having a second surface not adjoining the first semiconductor region;

a first electrode making contact with both the at least one contact region of the first semiconductor region and with the at least one third semiconductor region at the second surface; and a second electrode making contact with the first semiconductor region, the first semiconductor region having at least one channel region lying in a current path between the first electrode and the second electrode, the at least one the channel region being pinched off by the depletion zone of the first p-n junction and the depletion zone of the second p-n junction if a predetermined saturation current is reached between the first electrode and the second electrode, after which a current is limited to a limit current below the predetermined saturation current.

With the foregoing and other objects in view there is further provided, in accordance with the invention, a semiconductor configuration, including:

a first semiconductor region having a first surface and at least one contact region disposed at the first surface;

at least one second semiconductor region forming a p-n junction with the first semiconductor region and the p-n junction having a depletion zone;

a first electrode forming an ohmic contact on the at least one contact region of the first semiconductor region, the first electrode also forming a Shottky contact having a depletion zone on a region of the first semiconductor region which lies outside the at least one contact region; and a second electrode making contact with the first semiconductor region, the first semiconductor region having at least one channel region lying in a current path between the first electrode and the second electrode, the at least one channel region being pinched off by the depletion zone of the p-n junction and the depletion zone of the Shottky contact when a predetermined saturation current is reached between the first electrode and the second electrode, after which a current is limited to a limit current below the predetermined saturation current.

These semiconductor configurations automatically limit a current, in particular a short-circuit current, to an acceptable current value, the reverse current (limit current), by an advantageous combination of physical effects in the channel region.

In a particularly advantageous embodiment of the semiconductor configuration, this embodiment also being particularly resistant to breakdown, the second semiconductor region is disposed within the first semiconductor region below the contact region and runs further than the contact region in all directions parallel to the surface of the first semiconductor region. Owing to the charge storage in the second semiconductor region and the resulting persistent pinching-off of the channel region even in the event of subsequent voltage decreases at the two electrodes, the semiconductor configuration is now able essentially to maintain the reverse current as an acceptable current value over a predetermined blocking time (limiting time).

The relaxation time (charge decay time) of the charges stored in the second semiconductor region and thus the limiting time in the current-limiting characteristic curve of the semiconductor configuration can now be set in a targeted manner by establishing an electrical coupling between the first electrode and the second semiconductor region. The impedance of this coupling then determines the relaxation time. In particular, the first electrode can be contact-connected to a free surface of the second semiconductor region directly or via an electrical coupling circuit provided on the semiconductor configuration or separately therefrom. In order to set the coupling impedance, it is possible, in particular, to select a relatively high non-reactive resistance between the second semiconductor region and the contact region, for example by interposing a conductive polysilicon connection.

The semiconductor configuration is given a vertical structure, which consequently has a particularly high dielectric strength, if the second electrode is disposed on a second surface of the first semiconductor region, the second surface being remote from the first surface.

It is preferable for a plurality of contact regions to be provided at the first surface of the first semiconductor region, to which contact regions the first electrode is assigned as a common electrode.

A coherent second semiconductor region may be disposed below the contact regions and is extended further than the contact regions in their entirety in all directions parallel to the first surface of the first semiconductor region and preferably has openings through which further channel regions in the first semiconductor region, which are electrically connected in series with the channel regions mentioned, run, preferably vertically.

However, it is also possible to dispose, below each contact region, in each case an associated second semiconductor region in the first semiconductor region, between which additional channel regions of the first semiconductor region run and, in the current path, are electrically connected in series with in each case at least one of the channel regions assigned to the contact regions.

Each contact region preferably has a higher charge carrier concentration than the remaining zones of the first semiconductor region.

The semiconductor preferably used for the semiconductor configuration is a semiconductor having an energy gap of at least 2 eV, which is distinguished by a low intrinsic charge carrier concentration (charge carrier concentration without doping) which in turn has a positive influence on the charge storage effect.

The charge storage effect is particularly large if silicon carbide (SiC) is provided as the semiconductor material for the semiconductor regions of the semiconductor configuration, since SiC has an extremely low intrinsic charge carrier concentration. Further advantages of SiC are its high breakdown strength, low power loss, high temperature resistance, chemical resistance and high thermal conductivity.

Preferred polytypes of SiC are the 4H, 6H and 3C polytypes. Preferred dopants for SiC are boron and aluminum for p-type doping and nitrogen for n-type doping. However, other semiconductors are also suitable, in particular silicon (Si).

A highly suitable material for the first electrode is nickel (Ni). Other materials such as polysilicon or a metal, preferably tantalum (Ta), titanium (Ti) or tungsten (W), are likewise suitable.

A DC current limiter is realized in that one electrode of the semiconductor configuration can be electrically connected to the current source and the other electrode can be electrically connected to the load.

An AC current limiter is advantageously realized by two semiconductor configurations being reverse-connected in series between the current source and the electrical load. Charge storage in the second semiconductor regions prevents the current from being repeatedly switched on in the event of polarity alternation of the AC voltage.

Other features which are considered as characteristic for the invention are set forth in the appended claims.

Although the invention is illustrated and described herein as embodied in a semiconductor configuration and use thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
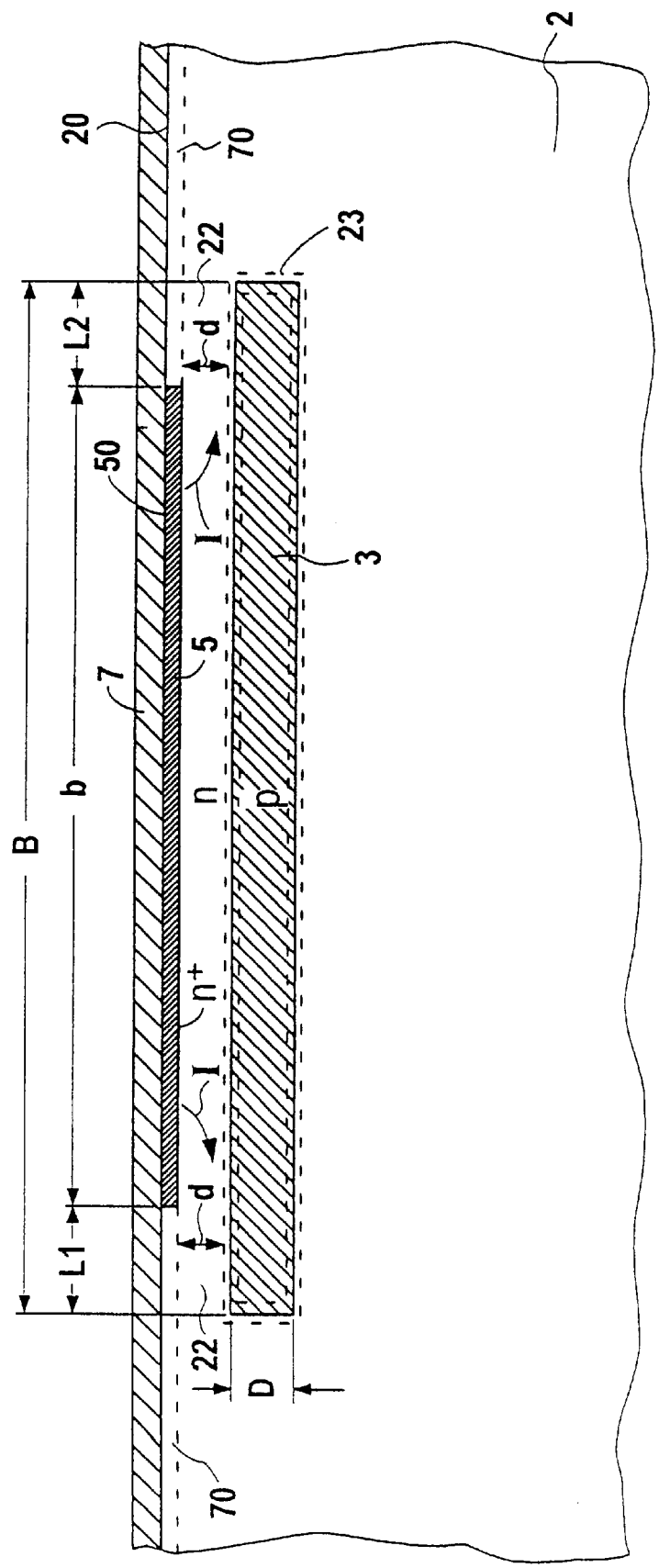
FIG. 1 is a diagrammatic, fragmented, sectional view of one embodiment of a semiconductor configuration having a lateral channel region which is bounded by a p-n junction at the bottom and a Shottky contact at the top.

In all the figures of the drawing, sub-features and integral parts that correspond to one another bear the same reference symbol in each case. Referring now to the figures of the drawing in detail and first, particularly, to FIGS. 1 and 2 thereof, there are shown semiconductor configurations which in each case contain a first semiconductor region 2 of an n-conductivity type (electron conduction) and a second semiconductor region 3 of a p-conductivity type (hole conductivity). The first semiconductor region 2 has a planar (flat) surface 20. The second semiconductor region 3 is disposed (buried) below the surface 20 within the first semiconductor region 2 and runs laterally, that is to say essentially parallel to the surface 20 of the first semiconductor region 2, at least on its side facing the surface 20 of the first semiconductor region 2. The second semiconductor region 3 is preferably produced by ion implantation of dopant particles into the surface 20 of the first semiconductor region 2. A desired doping profile is set by the penetration profile in the course of the ion implantation by ion energy taking account of any implantation masks. In particular, this yields a depth of the second semiconductor region 3, that is to say the distance between the second semiconductor region 3 and the surface 20 of the first semiconductor region 2, and a vertical extent D of the second semiconductor region 3, that is to say the extent measured perpendicularly with respect to the surface 20 of the first semiconductor region 2. In particular, the vertical extent D is between 0.1 $\mu$m and 1.0 $\mu$m. A lateral extent of the second semiconductor region 3 parallel to the surface 20 of the first semiconductor region 2 in the cross section illustrated is designated by B and is generally chosen to be between 10 $\mu$m and 30 $\mu$m. A p-n junction, whose depletion zone (space charge zone) is designated by 23 and is illustrated by dashed lines, is formed between the first semiconductor region 2 and the oppositely doped second semiconductor region 3. The depletion zone 23 of the p-n junction surrounds the entire second semiconductor region 3. As is known, the extent of a depletion zone of a p-n junction into a p-type region and an n-type region in this case depends on the stipulation of the charge carrier concentrations resulting from the doping concentrations in accordance with Poisson's law and the principle of the conservation of charge and also the voltage across the p-n junction (potential difference).

Figure 2:
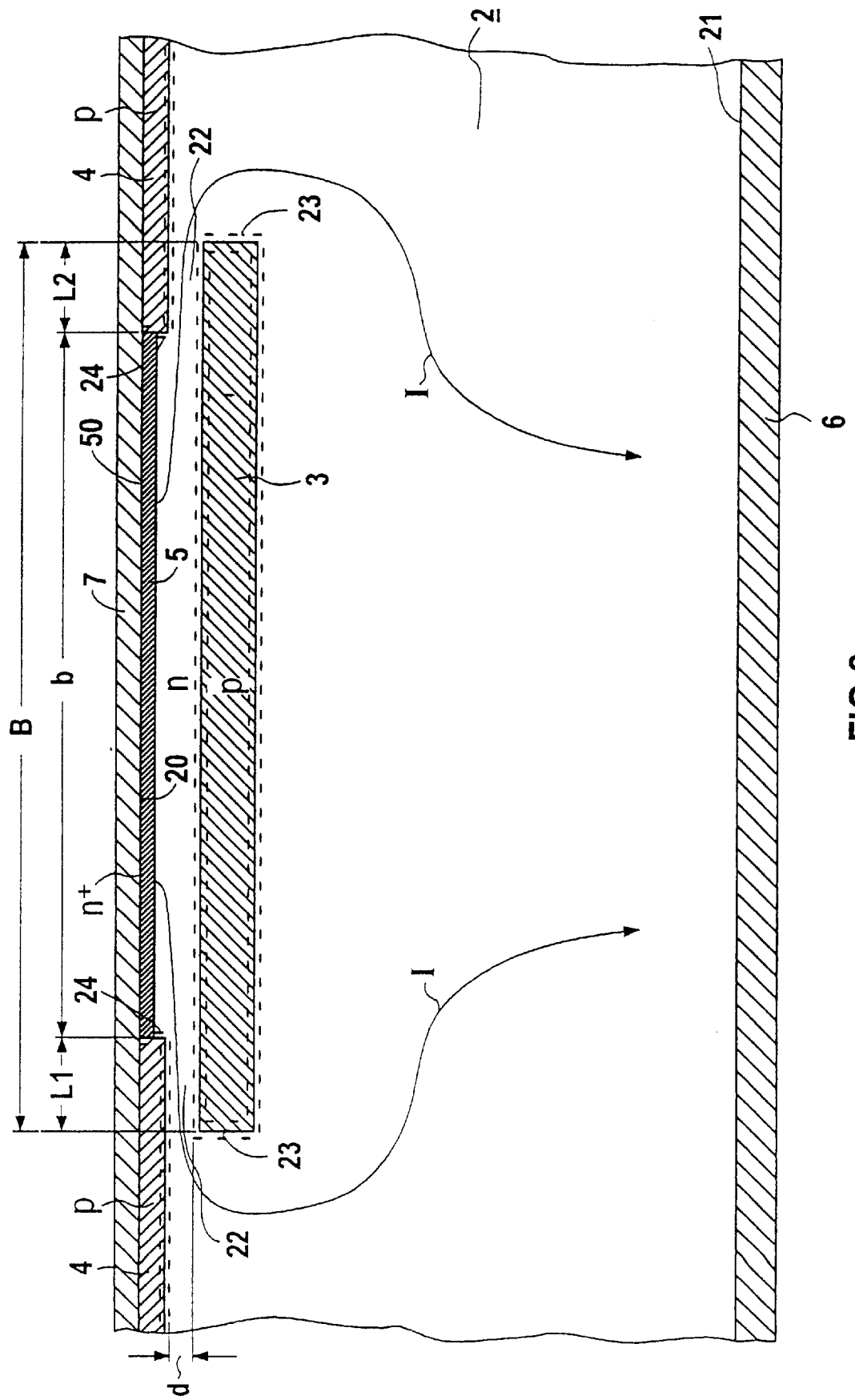
FIG. 2 is a fragmented, sectional view of the semiconductor configuration having the lateral channel region which is bounded by two p-n junctions.

As shown in FIGS. 1 and 2, a contact region 5 for ohmic contact-making is provided at the surface 20 of the first semiconductor region 2.. The contact region 5 is preferably doped more highly than, and of the same conductivity type as, the first semiconductor region 2, indicated by n+ in the exemplary embodiment illustrated. A lateral extent of the contact region 5 in the cross section illustrated is designated by b and is smaller than the lateral extent B of the second semiconductor region 3 in all directions parallel to the surface 20 of the first semiconductor region 2. The lateral extent b of the contact region is usually between 6 $\mu$m and 28 $\mu$m. The second semiconductor region 3 and the contact region 5 are disposed relative to one another in such a way that, in a projection perpendicular to the surface 20 of the first semiconductor region 2, the projection of the contact region 5 lies completely within the projection of the second semiconductor region 3.

A first electrode 7 made of an electrically conductive material is disposed on a free surface 50 of the contact region 5. The first electrode 7 also extends over the adjoining semiconductor surface.

In the embodiment as shown in FIG. 1, the first electrode 7 now forms an ohmic contact on the contact region 5 and a Schottky contact, whose depletion zone (depletion layer) is designated by 70 and is illustrated by dashed lines, on the surface 20 of the first semiconductor region 2. This can be achieved for example by suitable setting of the charge carrier concentration of the contact region 5 and of the first semiconductor region 2 during the doping process. The first semiconductor region 2 and the contact region 5 are each composed of the particularly advantageous semiconductor material silicon carbide (SiC), in which case, in particular, the dopant concentration of the contact region 5 is chosen to be above approximately $1\cdot10^{19}$ cm$^{-3}$ and that of the first semiconductor region 2 is chosen to be less than approximately $2\cdot10^{16}$ cm$^{-3}$. Nickel (Ni) is then advantageously provided as material for the first electrode 7.

In the embodiment as shown in FIG. 2, on the other hand, a third semiconductor region 4 is disposed at the surface 20 of the first semiconductor region 2. The third semiconductor region being of the opposite conductivity type to the first semiconductor region 2, that is to say of the p-conductivity type in the exemplary embodiment illustrated, and preferably likewise being produced by ion implantation. A p-n junction, whose depletion zone is designated by 24 and is illustrated by dashed lines, is formed between the first semiconductor region 2 and the third semiconductor region 4. The first electrode 7 also extends over the third semiconductor region 4 and forms an ohmic contact both on the contact region 5 and on the third semiconductor region 4.

A laterally extending semiconducting channel region 22 is in each case formed in the first semiconductor region 2 between the Schottky contact as shown in FIG. 1. The contact being disposed at the first surface 20 of the first semiconductor region 2 and being formed with the first electrode 7, or the third semiconductor region 4 as shown in FIG. 2, on the one hand, and the buried second semiconductor region 3, on the other hand. The lateral extents L1 and L2 of the channel region 22 on different sides of the contact region 5 may have the same magnitude or else different magnitudes. The channel lengths L1 and L2 are typically between 1 $\mu$m and 5 $\mu$m. The vertical extent of the channel region 22, that is to say the extent directed essentially perpendicularly with respect to the surface 20, is generally chosen to be between 0.1 $\mu$m and 1 $\mu$m. Since the depletion zones 23 and 70 in FIG. 1 and 23 and 24 in FIG. 2 extending into the channel region 22 have a significantly higher electrical resistance than the first semiconductor region 2, as a result of the great depletion of charge carriers, essentially only the inner zone of the channel region 22 is capable of carrying current. The inner zone being bounded by the depletion zone 23 at the bottom and by the depletion zone 70 in FIG. 1 and 24 in FIG. 2 at the top. The vertical extent of this current-carrying inner zone of the channel region 22 is designated by d.

In FIG. 2 the third semiconductor region 4 is disposed such that it is laterally offset with respect to the second semiconductor region 3 in such a way that the two semiconductor regions 3 and 4 overlap along the channel length L1 on one side and the channel length L2 on the other side when projected onto the surface 20 of the first semiconductor region 2. The third semiconductor region 4 laterally encloses the contact region 5 and directly adjoins the contact region 5, so that L1+b+L2=B holds true for the lateral extents L1, L2, b and B. Alternatively, the contact region 5 may be spaced apart laterally from the third semiconductor region 4.

In the two embodiments shown in FIG. 1 and FIG. 2, moreover, a second electrode 6 is provided, which is illustrated only in FIG. 2 and is disposed in such a way that the channel region 22 lies in the current path between the two electrodes 6, 7. The second electrode 6 is/may be disposed for example on the first surface 20 of the first semiconductor region 2 (lateral structure) or, as shown in FIG. 2, be disposed on a further surface 21 of the first semiconductor region 2. The further surface being remote from the first surface 20 of the first semiconductor region 2 (vertical structure).

An operating forward voltage is applied to the semiconductor configuration between the second electrode 6 and the first electrode 7. In the exemplary embodiments shown in FIG. 1 and FIG. 2 the first electrode 7 is connected to the cathode and the second electrode 6 to the anode of the operating voltage source. If the conductivity types of the semiconductor regions are interchanged, the polarity of the operating voltage is correspondingly interchanged.

The behavior of the semiconductor configuration when an operating forward voltage is applied is now dependent on the electric current I flowing through the semiconductor configuration between the electrodes 6 and 7. The electric current I flows between the two electrodes 6 and 7 along a current path—indicated by arrows—first of all essentially laterally through the channel region 22 in the first semiconductor region 2 and then, largely vertically in the exemplary embodiment as shown in FIG. 2, through the bulk zone of the first semiconductor region 2. With a rising current intensity I, the forward voltage drop between the electrodes 6 and 7 increases, with the result that the second semiconductor region 3 and the Schottky contact as shown in FIG. 1 or the third semiconductor region 4 as shown in FIG. 2 are biased negatively with respect to the second electrode 6. The increased forward voltage drop acts as a higher reverse voltage at the p-n junction between the first semiconductor region 2 and the second semiconductor region 3 and at the Schottky contact as shown in FIG. 1 or the third semiconductor region 4 as shown in FIG. 2 and thus leads to an enlargement of the depletion zones 23 and 70 and 24, respectively. This results in a reduction in the cross section and a corresponding increase in the resistance of the semiconducting zone of the channel region 22. When a specific critical current value (saturation current) $I_{sat}$ is reached, the depletion zones 23 and 70 or 24, respectively, touch one another and completely pinch off the channel region 22. Owing to the now considerably higher electrical resistance in the channel region 22, the current now reaches saturation and remains at the saturation current value $I_{sat}$, with the voltage between the electrodes 6 and 7 remaining constant. The saturation current $I_{sat}$ of the semiconductor configuration is set to a desired value by way of the geometrical dimensions of the channel region 22, in particular the lateral extents L1 and L2 and vertical extent d thereof, and also by way of the charge carrier concentration, defined by the doping, of the channel region 22.

If, on the other hand, as in the case of a short circuit, by way of example, the voltage between the electrodes 6 and 7 continues to rise after the current I has already reached the saturation current value $I_{sat}$, the electrical power loss in the channel region 22 increases and the channel region 22 heats up. As the internal temperature in the channel region 22 increases, the mobility of those charge carriers which have remained in the depletion zones 23 and 70 or 24 covering the channel region 22 then decreases. Consequently, the conductivity of the channel region 22 falls further, with the consequence that, on account of the resulting higher forward voltage drop between the electrodes 6 and 7, the mobile charge carriers are depleted in an intensified fashion from the depletion zones 23 and 70 or 24 in the channel region 22. On account of this feedback effect, the semiconductor configuration also rapidly limits a greatly increasing electric current, as in the event of a short circuit, to a noncritical current value (limit current) $I_B$, which is distinctly below the saturation current $I_{sat}$, for example by a factor of 0.2 at most ($I_{sat} \geq 5\ I_B$), and, in the event of high reverse voltages being reached, essentially corresponds to the reverse current of the semiconductor configuration at the desired breakdown voltage, which may typically lie between 60 V and 1200 V (for example also 700 V).

In the space charge zone 23 around the buried second semiconductor region 3, the accumulated space charge remains stored depending on the intrinsic charge carrier concentration of the semiconductor. As a result of the charge storage the electrical potential in the second semiconductor region 3 is largely preserved even in the event of the voltage between the two electrodes 6 and 7 decreasing again, and the channel region 22 remains closed. Consequently, the semiconductor configuration achieves rapid and reliable limiting of the current I to the reverse current $I_B$.

The semiconductor for the semiconductor regions 2, 3 and 4 of the semiconductor configuration is silicon carbide (SiC). This makes the charge storage effect particularly pronounced. Dopants for SiC are boron and aluminum for p-type doping and nitrogen for n-type doping.

The dopings of the first semiconductor region 2, of the second semiconductor region 3 and of the third semiconductor region 4 determine the blocking ability of the semiconductor configuration when a voltage is applied in the reverse direction between the two electrodes 6 and 7.

After the aforementioned ion implantations of the semiconductor regions 3, 4 and 5, in general thermal annealing processes are carried out in order to reduce lattice defects. Instead of ion implantation, in order to fabricate the contact region 5 and the third semiconductor region 4, it is also possible to use epitaxial growth of corresponding semiconductor layers and subsequent patterning of these layers (for example mesa structures) or, particularly in the case of silicon, also a diffusion process.

Figure 3:
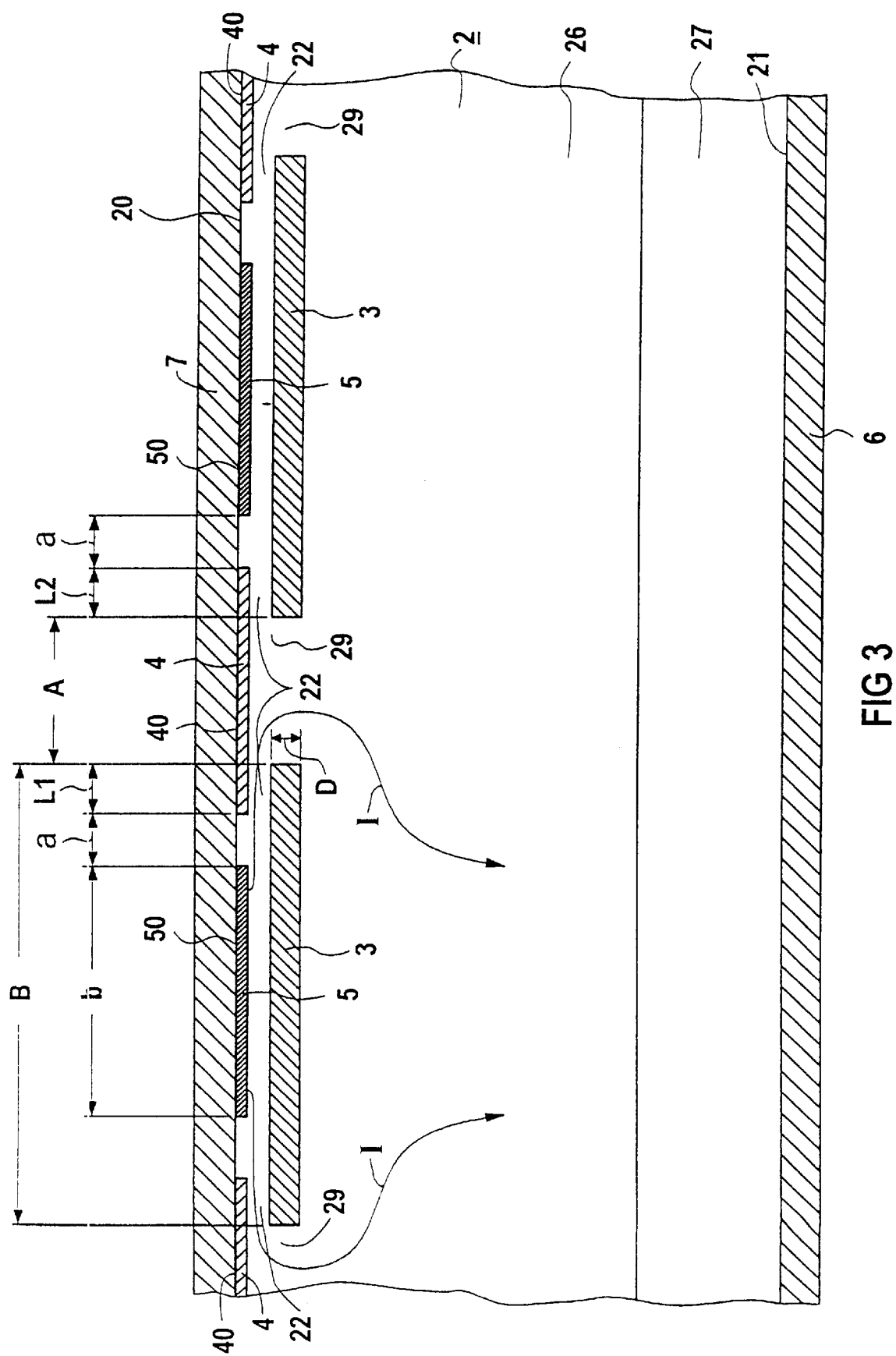
FIG. 3 is a fragmented, sectional view of an embodiment of the semiconductor configuration having lateral and vertical channel regions.

FIG. 3 shows a semiconductor configuration in which the first semiconductor region 2 is composed of a substrate 27 and, disposed on top of the latter, an epitaxially grown semiconductor layer 26 of the same conduction type as, and generally with a lower charge carrier concentration than, the substrate 27. A plurality of the contact regions 5, which are doped identically to, but preferably higher than, the semiconductor layer 26, are disposed spaced apart from one another at the surface 20 of the semiconductor layer 26, only two of the contact regions 5 being illustrated. Below the contact regions 5, a respective one of the second semiconductor regions 3, doped oppositely to the semiconductor layer 26, or a respective partial zone of a coherent third semiconductor region 3 is buried in the semiconductor layer 26. Between the contact regions 5, in each case at a lateral distance, and preferably at an identical distance a, the third semiconductor region 4, doped oppositely to the semiconductor layer 26, is disposed at the surface 20 of the semiconductor layer 26. The lateral distance a between the contact regions 5 and the third semiconductor regions 4 is generally between 1 $\mu$m and 3 $\mu$m.

Contact is made with the free surface 20 of the semiconductor layer 26, the contact regions 5 and the third semiconductor regions 4 by an electrically conductive layer, preferably made of metal or polysilicon, as the first electrode 7.

The semiconductor regions 3 and 4 each run essentially laterally with respect to the surface 20 of the first semiconductor region 2. When projected along a direction perpendicular to the surface 20 each semiconductor region 4 over laps in each case two of the semi conductor regions 3 and each semiconductor region 3 overlaps in each case two of the semiconductor regions 4. As a result, as in FIG. 1 again laterally running channel regions 22 having the lateral channel lengths L1 and L2 are formed in the semiconductor layer 26 between a respective second semiconductor region 3 and a respective third semiconductor region 4. The lateral extent B of the buried second semiconductor regions 3 is B=b +2a+L1+L2. The second electrode 6 is again disposed on that side of the substrate 27 which is remote from the semiconductor layer 26, as the second surface 21 of the first semiconductor region 2. The operating voltage of the semiconductor configuration is applied between the second electrode 6 and the first electrode 7.

The buried semiconductor regions 3 are spaced apart laterally from one another, preferably at the same distance A, or openings each having a lateral extent A are formed in a coherent second semiconductor region 3. As a result, a channel region 29 of the first semiconductor region 2 having the lateral extent A and the vertical extent D is formed between each of the second semiconductor regions 3, and runs essentially vertically with respect to the surface 20. The semiconducting zone in each channel region 29 is bounded laterally by the depletion zones (not illustrated) of the p-n junctions formed by the semiconductor layer 26 and the second semiconductor regions 3 (also illustrated in FIG. 4).

The lateral extent A of the vertical channel regions 29 is preferably chosen to be so small that the maximum reverse voltage that can be applied between the two electrodes 6 and 7 at least largely corresponds to the maximum bulk reverse voltage that can be borne by the p-n junction between the semiconductor regions 2 and 3 at the underside of the second semiconductor regions 3. This corresponds to an at least largely planar profile of the equipotential lines in the blocking case (reduced voltage punch-through). Typical values for the lateral extent A are between 1 $\mu$m and 10 $\mu$m.

When a forward-biased operating voltage is applied, the current I flows between the first electrode 7 and the second electrode 6 along the arrows illustrated which current first of all runs through the lateral channel regions 22 and then, in a practically vertical direction with respect to the surface 20, through the vertical channel regions 29 in the semiconductor layer 26 and then essentially vertically through the semiconductor layer 26 and the substrate 27 to the second electrode 6.

Figure 4:
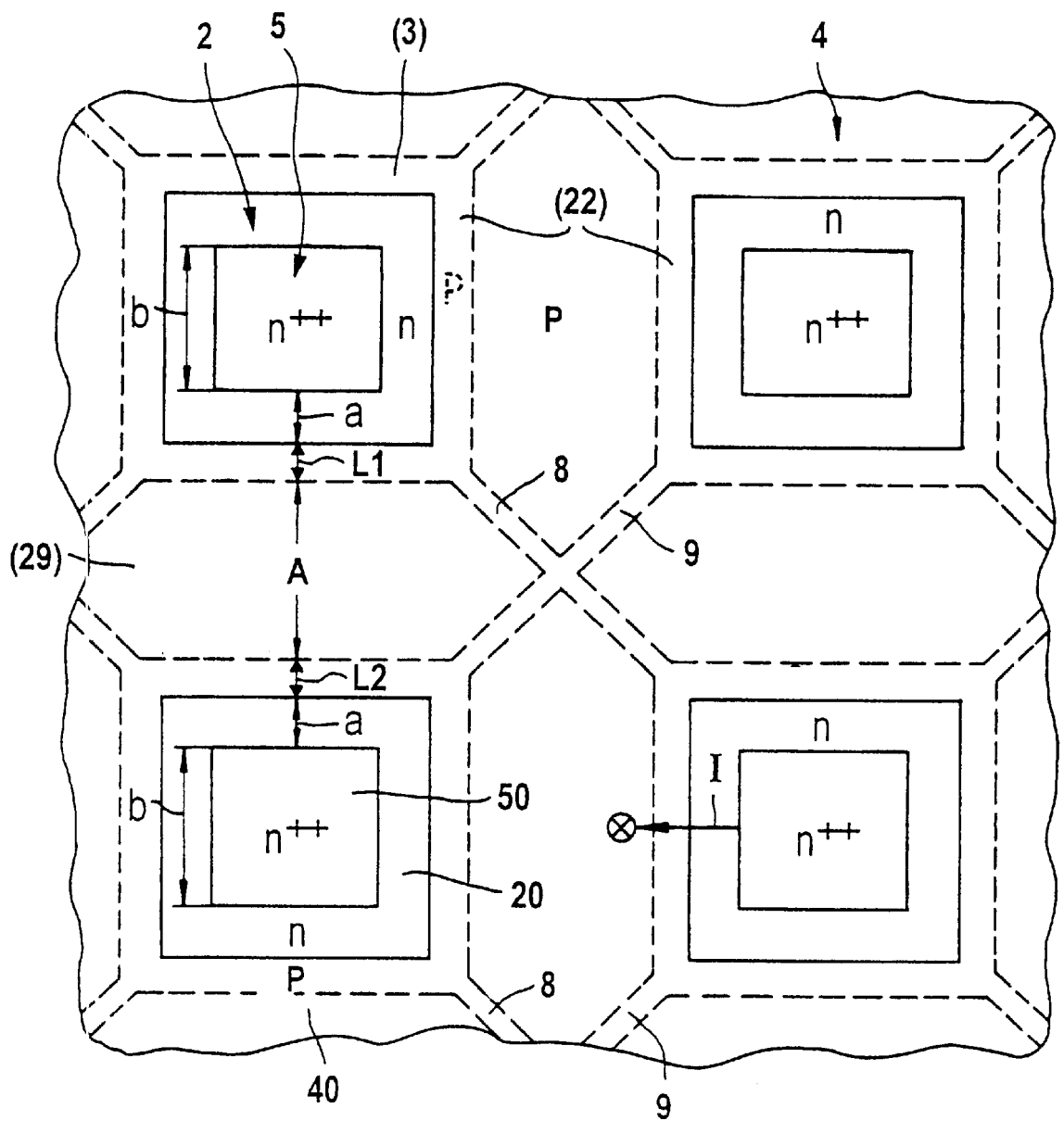
FIG. 4 is a plan view of the semiconductor configuration with a cell configuration.

FIG. 4 shows one embodiment of a semiconductor configuration in a plan view of the semiconductor surface without the first electrode 7. In a cell configuration, a plurality of at least approximately square cells are provided, each containing an $n^{++}$-doped source region, formed as a square having the side length b, as the contact region 5, which is implanted in an n-doped semiconductor layer as the first semiconductor region 2. The cell further has the p-doped third semiconductor region 4, surrounding the $n^{++}$-type contact region 5 at a distance a, and the p-doped second semiconductor region 3, which is buried below the contact region 5 by implantation and is illustrated by dashed lines. The third semiconductor region 4 with the surface 40 is preferably implanted at the entire surface 20 of the first semiconductor region 2, with the exception of the square recesses for the contact regions 5 with surfaces 50 and the partial zones of the surface 20 of the first semiconductor region 2 which surrounds the contact regions 5. In the square ring-shaped overlap region having the width L1 or L2, the respective channel region 22 is again formed below the third semiconductor region 4 and above the second semiconductor region 3. In order to put the buried second semiconductor regions 3 at a common potential, the second semiconductor regions 3 are connected to one another via p-doped connections 8 and 9 running in a cruciform fashion in the first semiconductor region 2. Between the connections 8 and 9 and the adjacent third semiconductor regions 3, the continuous channel region 29, running approximately in the form of a rhombus having the width A and vertically with respect to the surface 40 or 20, is in each case disposed in the first semiconductor region 2 below the third semiconductor region 4. The current I flows from the contact regions 5, which could also be referred to as source regions, first of all laterally (that is to say horizontally) through the lateral channel region 22 and subsequently approximately vertically through the adjacent vertical channel regions 29.

The now listed dopant concentrations are generally chosen for the semiconductor made of SiC. For the first semiconductor region 2, in particular the semiconductor layer 26, in a range between approximately $2 \cdot 10^{17}$ cm$^{-3}$ (for a reverse voltage of approximately 60 V) through approximately $2 \cdot 10^{16}$ cm$^{-3}$ (for a reverse voltage of approximately 700 V) up to approximately $6 \cdot 10^{15}$ cm$^{-3}$ (for a reverse voltage of approximately 1200 V), for the substrate 27 also distinctly more than $1 \cdot 10^{18}$ cm$^{-3}$, and for the second semiconductor regions 3 and the third semiconductor regions 4 between approximately $1 \cdot 10^{18}$ cm$^{-3}$ and approximately $2 \cdot 10^{19}$ cm$^{-3}$, preferably approximately $5 \cdot 10^{18}$ cm$^{-3}$, and also for the contact region 5 above approximately $1 \cdot 10^{19}$ cm$^{-3}$. In an embodiment (not illustrated) using silicon as the semiconductor material, the dopant concentrations mentioned for SiC should generally be divided in each case by approximately 100 (that is to say are two orders of magnitude smaller).

All of the embodiments of the semiconductor configuration described can be implemented in different topologies, in particular in a cell configuration or else in a comb-like structure.

Figure 5:
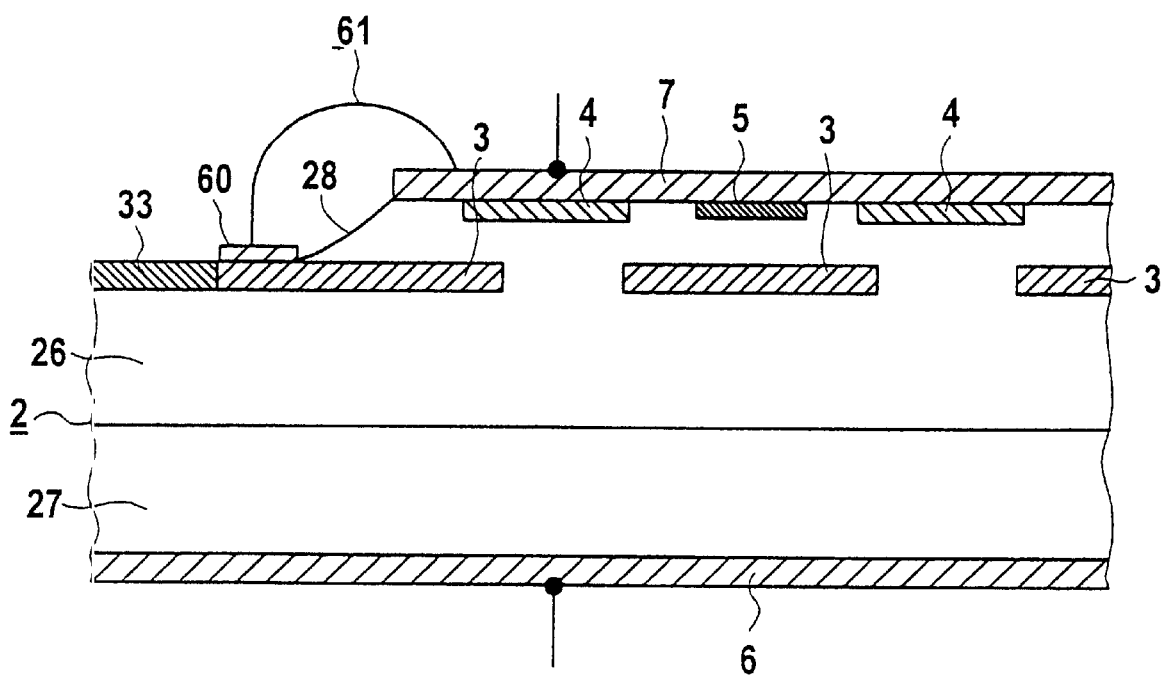
FIG. 5 is a fragmented, sectional view of the semiconductor configuration having buried semiconductor regions with which electrical contact is made at an edge.

FIG. 5 shows an advantageous development of the embodiment as shown in FIG. 3. At its edge, the semiconductor layer 26 is removed by eroding semiconductor material, for example by an etching process, down to the coherent, buried second semiconductor region 3. A contact 60 is applied on the exposed surface of the second semiconductor region 3. The contact 60 is electrically connected to the first electrode 7 via an electrical connection 61. The second semiconductor regions 3 are coupled to the third semiconductor regions 4 at the surface 20 via the electrical connection 61. The electrical connection 61 may be integrated on the semiconductor configuration or may also be an external wiring configuration, in particular via an electric circuit. A defined relaxation time (charge dissipation time) of the charges stored in the second semiconductor region 3 in the event of a short circuit can be set by the choice of electrical impedance of the electrical connection 61. In general, the electrical connection 61 has a higher electrical resistance than the first electrode 7 and, for this purpose, may contain a higher-resistance polysilicon line section. Adjoining the exposed second semiconductor region 3 provision is made of an areal edge termination 33, which has the same conductivity type but generally a lower charge carrier concentration than the second semiconductor region 3, for reducing the field strength at the surface. As a modification to FIG. 5, contact can also be made with the buried second semiconductor regions 3 in an inner zone of the semiconductor configuration.

The embodiments with the Schottky contacts and the embodiments with the additional p-n junctions with the third semiconductor regions 4 at the surface 20 of the first semiconductor region 2 can also be combined with one another, in that, for the purpose of limiting the electrical punch-through to the first electrode 7, there are provided next to one another Schottky contacts and additional p-n junctions at the same surface 20 of the first semiconductor region 2.

The semiconductor configurations described above are unipolar components which are outstandingly suitable for limiting short-circuit direct currents and, at the same time, operate intrinsically safely and without any driving (passively). By virtue of the configuration of the semiconductor configuration as a current limiter, it is possible to set a desired saturation current $I_{sat}$, which lies above a rated current range and also a regular over-current range that can still be tolerated, and starting from which the semiconductor configuration automatically limits the current to the lower reverse current $I_B$ with the take-up of voltage.

In an embodiment (not illustrated) of the current limiter which is also suitable for AC voltages, a series circuit formed by the first semiconductor configuration as shown in one of FIGS. 1 to 5 and a first diode for the reverse voltage and a further series circuit formed by a second semiconductor configuration as shown in one of FIGS. 1 to 5 and a second diode for the reverse voltage thereof are reverse-connected in parallel. The two diodes may be p-n rectifier diodes or else Schottky diodes, in particular based on SiC. The characteristic curve of this AC current limiter is then encumbered with the diode threshold voltages.

Figure 6:
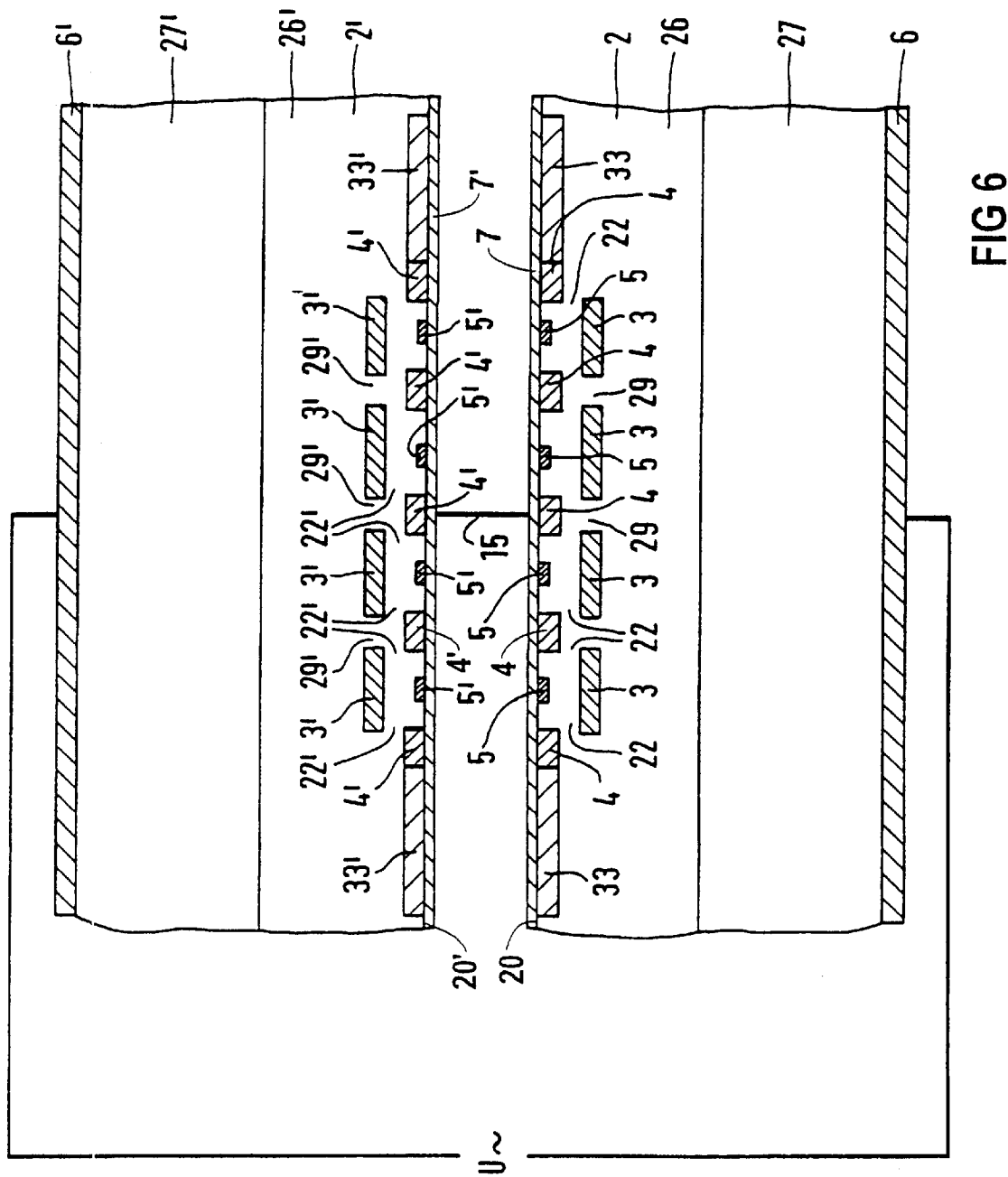
FIG. 6 is a fragmented, sectional view of an AC current limiter having two semiconductor configurations reverse-connected in series.

A particularly advantageous embodiment of an AC current limiter is illustrated in FIG. 6. Two identical semiconductor configurations constructed in a similar manner to FIG. 3 are reverse-connected in series, with the result that each of the two semiconductor configurations limits one short-circuit half-cycle (current polarity). For this purpose, the first electrodes 7 and 7' of the two semiconductor configurations are electrically contact-connected to one another via an electrical connection 15 and the two second electrodes 6 and 6' are each electrically connected to a pole of the AC voltage. The outermost third semiconductor regions 4 and 4' are surrounded by the areal edge termination 33, doped oppositely to the semiconductor layer 26 and 26', respectively, for reducing the field strength at the surface 20 and 20', respectively, and passivation. The charge storage effect in the second semiconductor regions 3 and 3' prevents repeated switching on during the subsequent AC voltage periods in the event of a short circuit, with the result that the current remains limited to the low reverse current $I_B$.

Figure 7:
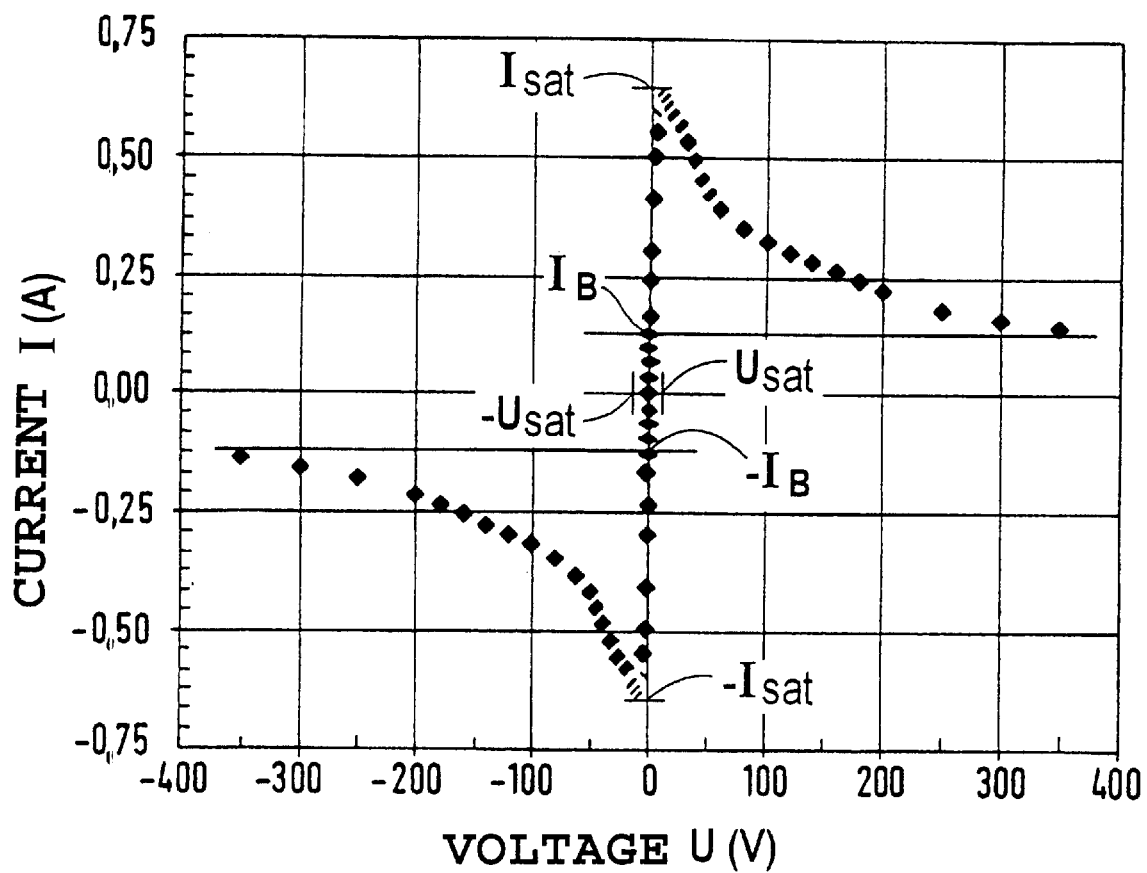
FIG. 7 is a graph of a measured characteristic curve of the AC current limiter as shown in FIG. 6.

The measured current-voltage characteristic curve of the AC current limiter, formed from SiC, as shown in FIG. 6 is shown in FIG. 7. The characteristic curve shows the outstanding suitability of the semiconductor configuration as a current-limiting component. In a nominal current range over a nominal voltage range around 0 V, the AC current limiter exhibits an ohmic behavior with a very small forward resistance and, as a result, also very small on-state losses. In the event of a saturation current $I_{sat}$ being reached at a positive saturation voltage $+U_{sat}$, and $-I_{sat}$ at a negative voltage $-U_{sat}$, the current I is limited to a limit current $+I_B$ and $-I_B$, respectively, if the magnitude of the voltage U continues to increase as in the event of a short circuit.

Figure 8:
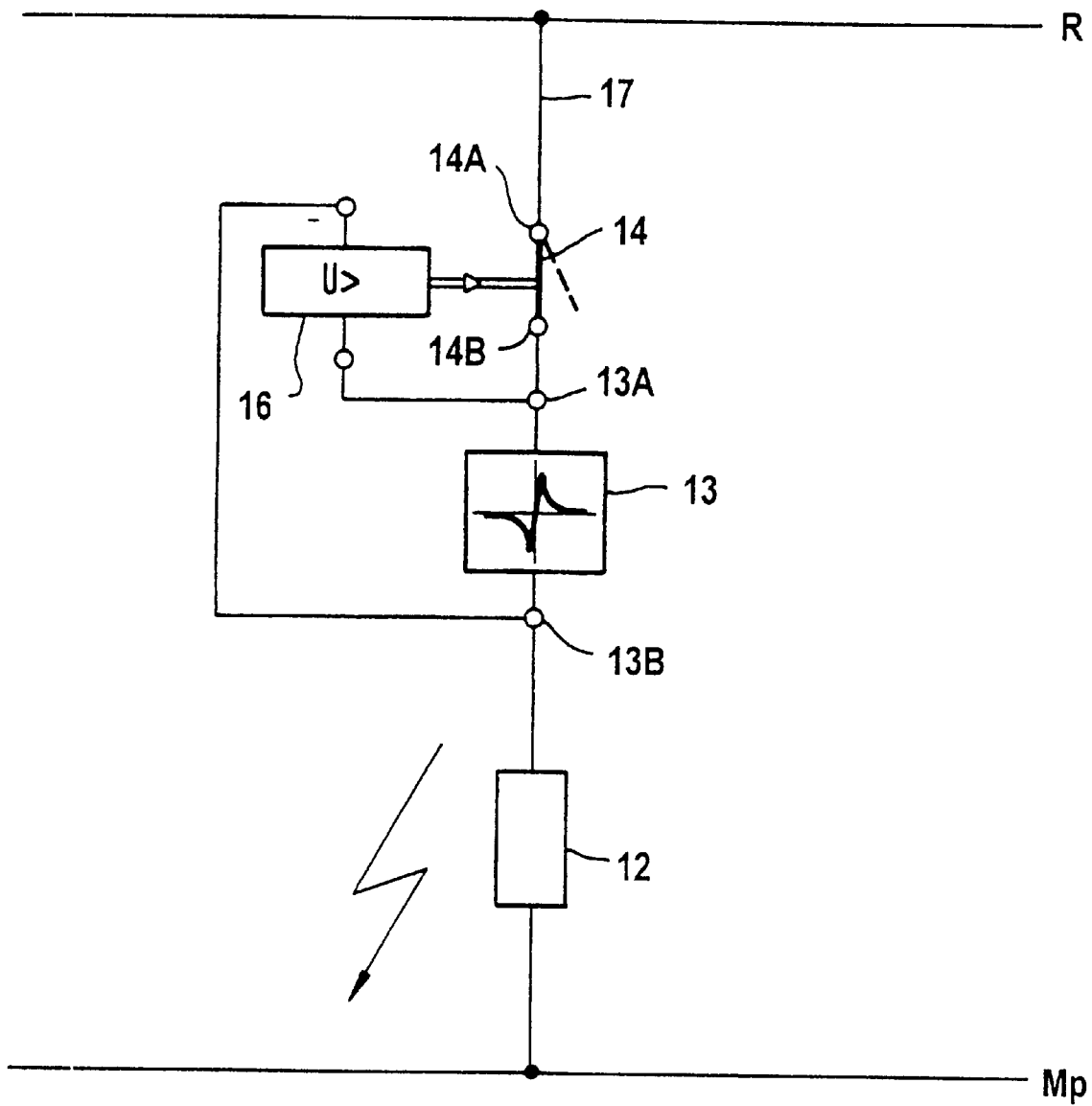
FIG. 8 is a block diagram of a switching device with the current limiter in a line branch.

FIG. 8 illustrates a switching device in a line branch 17 between a phase R and ground potential Mp of an electrical supply network, for example of a building installation, for an electrical load 12. The switching device contains an electronic current limiter 13, which, in particular, may be configured in the manner shown in one of FIGS. 1 to 6, an over-voltage release 16, which taps off the voltage drop between two tapping points 13A and 13B of the current limiter 13, and a switching relay 14, which is switched into the line branch 17 in series with the current limiter 13 upstream of the load 12. The switching relay 14 is triggered (opened) by the over-voltage release 16 in the event of a limit voltage being exceeded at the current limiter 13, in order to electrically isolate the load 12 from the network (R) in the event of a short circuit. In this case, the switching relay 14 does not have to be particularly fast, nor are its contacts stressed by electric arcs during the current limiting, since the electronic current limiter 13 limits the current very rapidly in distinctly less than one millisecond.

We claim:

1. A semiconductor configuration, comprising:
    a first semiconductor region having a first surface and at least one contact region disposed at said first surface;
    at least one second semiconductor region forming a first p-n junction with said first semiconductor region and said first p-n junction having a depletion zone;
    at least one third semiconductor region disposed at said first surface of said first semiconductor region forming a second p-n junction with said first semiconductor region and said second p-n junction having a depletion zone, said at least one third semiconductor region having a second surface not adjoining said first semiconductor region;
    a first electrode making contact with both said at least one contact region of said first semiconductor region and with said at least one third semiconductor region at said second surface; and
    a second electrode making contact with said first semiconductor region, said first semiconductor region having at least one channel region lying in a current path between said first electrode and said second electrode, said at least one said channel region being pinched off by said depletion zone of said first p-n junction and said depletion zone of said second p-n junction if a predetermined saturation current is reached between said first electrode and said second electrode, after which a current is limited to a limit current below the predetermined saturation current.

2. The semiconductor configuration according to claim 1, wherein said at least one third semiconductor region encloses said at least one contact region parallel to said first surface of said first semiconductor region.

3. A semiconductor configuration, comprising:
    a first semiconductor region having a first surface and at least one contact region disposed at said first surface;

at least one second semiconductor region forming a p-n junction with said first semiconductor region and said p-n junction having a depletion zone;

a first electrode forming an ohmic contact on said at least one contact region of said first semiconductor region, said first electrode also forming a Shottky contact having a depletion zone on a region of said first semiconductor region which lies outside said at least one contact region; and a second electrode making contact with said first semiconductor region, said first semiconductor region having at least one channel region lying in a current path between said first electrode and said second electrode, said at least one channel region being pinched off by said depletion zone of said p-n junction and said depletion zone of said Shottky contact when a predetermined saturation current is reached between said first electrode and said second electrode, after which a current is limited to a limit current below the predetermined saturation current.

4. The semiconductor configuration according to claim 1, wherein said at least one second semiconductor region is disposed within said first semiconductor region below said at least one contact region and extends further than said at least one contact region in all directions parallel to said first surface of said first semiconductor region.

5. The semiconductor configuration according to claim 1, wherein said first semiconductor region has a second surface remote from said first surface, and said second electrode is disposed on said second surface of said first semiconductor region.

6. The semiconductor configuration according to claim 1, wherein said at least one contact region is a plurality of contact regions disposed at said first surface.

7. The semiconductor configuration according to claim 6, wherein said at least one second semiconductor region is a coherent semiconductor region disposed below said plurality of contact regions and extends further than said plurality of contact regions in their entirety in all directions parallel to said first surface of said first semiconductor region.

8. The semiconductor configuration according to claim 4, wherein below said at least one contact region said at least one second semiconductor region is disposed in said first semiconductor region.

9. The semiconductor configuration according to claim 7, wherein said at least one second semiconductor region is a plurality of second semiconductor regions, and below each of said plurality of contact regions an associated one of said plurality of said second semiconductor regions is disposed in said first semiconductor region.

10. The semiconductor configuration according to claim 7, wherein said at least one channel region is a plurality of channel regions associated with said plurality of contact regions, said coherent semiconductor region has openings formed therein, said first semiconductor region has additional channel regions running through said openings in said coherent semiconductor region and, in said current path, said additional channel regions are electrically connected in series with in each case at least one of said plurality of channel regions associated with said plurality of contact regions.

11. The semiconductor configuration according to claim 9, wherein said at least one channel region is a plurality of channel regions associated with said plurality of contact regions, said first semiconductor region has additional channel regions running between adjacent ones of said plurality of said second semiconductor regions assigned to said plurality of said contact regions and, in said current path, said additional channel regions are electrically connected in series with in each case at least one of said plurality of channel regions associated with said plurality of contact regions.

12. The semiconductor configuration according to claim 11, wherein said additional channel regions run substantially vertically with respect to said first surface.

13. The semiconductor configuration according to claim 1, wherein said first semiconductor region, said at least one second semiconductor region and said at least one third semiconductor region are formed from a semiconductor material having an energy gap of at least 2 eV.

14. The semiconductor configuration according to claim 13, wherein said first semiconductor region, said at least one second semiconductor region and said at least one third semiconductor region are formed from silicon carbide.

15. The semiconductor configuration according to claim 1, wherein said first electrode is at least partly composed of nickel.

16. The semiconductor configuration according to claim 1, wherein said first electrode is electrically coupled to said at least one second semiconductor region in such a way as to produce a predetermined relaxation time for stored charges in said at least one second semiconductor region.

17. The semiconductor configuration according to claim 16, wherein said first electrode is at least partly composed of polysilicon.

18. The semiconductor configuration according to claim 16, including an electrical connection disposed between said first electrode and said at least one second semiconductor region, said first electrode and said electrical connection are at least partly composed of polysilicon.

19. The semiconductor configuration according to claim 1, wherein said first semiconductor region has a higher charge carrier concentration in said at least one contact region than in other remaining zones.

20. The semiconductor configuration according to claim 1, wherein said saturation current is at least five times said limit current.

21. A current limiter circuit, comprising:

a semiconductor configuration, including:
    a first semiconductor region having a first surface and at least one contact region disposed at said first surface;
    at least one second semiconductor region forming a first p-n junction with said first semiconductor region and said first p-n junction having a depletion zone;
    at least one third semiconductor region disposed at said first surface of said first semiconductor region forming a second p-n junction with said first semiconductor region and said second p-n junction having a depletion zone, said at least one third semiconductor region having a second surface not adjoining said first semiconductor region;
    a first electrode making contact with both said at least one contact region of said first semiconductor region and with said at least one third semiconductor region at said second surface; and
    a second electrode making contact with said first semiconductor region, said first semiconductor region having at least one channel region lying in a current path between said first electrode and said second electrode, said at least one said channel region being pinched off by said depletion zone of said first p-n junction and said depletion zone of said second p-n junction if a predetermined saturation current is reached between said first electrode and said second electrode, after which a current is limited to a limit current below the predetermined saturation current;

a current source connected to said first electrode of said semiconductor configuration; and an electrical load connected to said second electrode of said semiconductor configuration, said semiconductor configuration limiting direct currents between said current source and said electrical load.

22. A current limiter circuit, comprising:

two semiconductor configurations, each including:
- a first semiconductor region having a first surface and at least one contact region disposed at said first surface;
- at least one second semiconductor region forming a first p-n junction with said first semiconductor region and said first p-n junction having a depletion zone;
- at least one third semiconductor region disposed at said first surface of said first semiconductor region forming a second p-n junction with said first semiconductor region and said second p-n junction having a depletion zone, said at least one third semiconductor region having a second surface not adjoining said first semiconductor region;
- a first electrode making contact with both said at least one contact region of said first semiconductor region and with said at least one third semiconductor region at said second surface; and
- a second electrode making contact with said first semiconductor region, said first semiconductor region having at least one channel region lying in a current path between said first electrode and said second electrode, said at least one said channel region being pinched off by said depletion zone of said first p-n junction and said depletion zone of said second p-n junction if a predetermined saturation current is reached between said first electrode and said second electrode, after which a current is limited to a limit current below the predetermined saturation current;

a current source; and an electrical load, said two semiconductor configurations are reverse-connected in series between said current source and said electrical load for limiting alternating currents between said current source and said electrical load.

* * * * *